United States Patent
Leblanc

(10) Patent No.: US 7,093,084 B1
(45) Date of Patent: Aug. 15, 2006

(54) MEMORY IMPLEMENTATIONS OF SHIFT REGISTERS

(75) Inventor: Marcel A. Leblanc, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 555 days.

(21) Appl. No.: 10/309,717

(22) Filed: Dec. 3, 2002

(51) Int. Cl.
*G06F 12/00* (2006.01)

(52) U.S. Cl. .................. 711/154; 711/170; 711/167; 711/155; 711/104; 711/109

(58) Field of Classification Search ................ 711/154, 711/170, 167, 155, 104, 109
See application file for complete search history.

(56) References Cited

U.S. PATENT DOCUMENTS

| | | | |
|---|---|---|---|
| 3,824,562 A * | 7/1974 | Leibowitz et al. .......... 711/109 |
| 3,893,088 A * | 7/1975 | Bell ............................ 365/78 |
| 4,001,566 A * | 1/1977 | Stevenson ................... 708/190 |
| 4,393,482 A * | 7/1983 | Yamada ....................... 365/236 |
| 5,153,846 A * | 10/1992 | Rao ............................ 708/319 |
| 5,195,110 A * | 3/1993 | Gorshe ........................ 375/355 |
| 5,889,413 A | 3/1999 | Bauer ........................... 326/40 |
| 6,061,417 A | 5/2000 | Kelem ........................... 377/26 |
| 6,154,774 A * | 11/2000 | Furlong et al. .............. 709/224 |
| 6,262,597 B1 | 7/2001 | Bauer et al. ................... 326/41 |
| 6,288,568 B1 | 9/2001 | Bauer et al. ................... 326/39 |
| 6,314,539 B1 * | 11/2001 | Jacobson et al. ............ 714/727 |
| 6,388,466 B1 * | 5/2002 | Wittig et al. ................... 326/40 |
| 6,411,124 B1 | 6/2002 | Lee et al. ...................... 326/41 |
| 6,462,577 B1 | 10/2002 | Lee et al. ...................... 326/40 |
| 6,728,925 B1 * | 4/2004 | Ishiwatari et al. ........... 714/777 |

OTHER PUBLICATIONS

U.S. Appl. No. 09/761,609, filed Jan. 16, 2001, Lee et al.
U.S. Appl. No. 10/140,312, filed May 6, 2002, Lin et al.

* cited by examiner

*Primary Examiner*—Kimberly McLean-Mayo
(74) *Attorney, Agent, or Firm*—Fish & Neave IP Group, Ropes & Gray LLP

(57) ABSTRACT

A random access memory array is used as a shift register. Data is written into different locations in a first column of the memory and then gradually transferred successively to any other number of columns in the memory. Such column-to-column data transfer is the result of reading data from each column and presenting it for writing in the next column. To compensate for latency (delay) in the column-to-column data transfer, the circuitry that controls reading is kept ahead of the circuitry that controls writing by a number of read/write cycles that takes approximately the same amount of time as the column-to-column data transfer delay.

26 Claims, 3 Drawing Sheets

| CLOCK CYCLE | ROW ADDRESS | | DATA READ IN COL./CELL LOCATION | | | | DATA WRITTEN IN COL./CELL LOCATION | | | |
|---|---|---|---|---|---|---|---|---|---|---|
| | READ | WRITE | 11 | 10 | 01 | 00 | 11 | 10 | 01 | 00 |
| 1 | 10 | 00 | x | x | x | x | 1/m | x | x | x |
| 2 | 11 | 01 | x | x | x | x | 2/n | x | x | x |
| 3 | 00 | 10 | 1/m/x | x | x | x | 3/o | x | x | x |
| 4 | 01 | 11 | 2/n/m | x | x | x | 4/p | x | x | x |
| 5 | 10 | 00 | 3/o/n | x | x | x | 5/m | x | x | x |
| 6 | 11 | 01 | 4/p/o | x | x | x | 6/n | x | x | x |
| 7 | 00 | 10 | 5/m/p | 1/i/x | x | x | 7/o | 1/i | x | x |
| 8 | 01 | 11 | 6/n/m | 2/j/i | x | x | 8/p | 2/j | x | x |
| 9 | 10 | 00 | 7/o/n | 3/k/j | x | x | 9/m | 3/k | x | x |
| 10 | 11 | 01 | 8/p/o | 4/l/k | x | x | 10/n | 4/l | x | x |
| 11 | 00 | 10 | 9/m/p | 5/i/l | 1/e/x | x | 11/o | 5/i | 1/e | x |
| 12 | 01 | 11 | 10/n/m | 6/j/i | 2/f/e | x | 12/p | 6/j | 2/f | x |
| 13 | 10 | 00 | 11/o/n | 7/k/j | 3/g/f | x | 13/m | 7/k | 3/g | x |
| 14 | 11 | 01 | 12/p/o | 8/l/k | 4/h/g | x | 14/n | 8/l | 4/h | x |
| 15 | 00 | 10 | 13/m/p | 9/i/l | 5/e/h | 1/a/x | 15/o | 9/i | 5/e | 1/a |
| 16 | 01 | 11 | 14/n/m | 10/j/i | 6/f/e | 2/b/a | 16/p | 10/j | 6/f | 2/b |

FIG. 2

MEMORY IMPLEMENTATIONS OF SHIFT REGISTERS

BACKGROUND OF THE INVENTION

This invention relates to implementation of shift registers using memory arrays.

Lin et al. U.S. patent application Ser. No. 10/140,312, filed May 6, 2002, shows a technique for using a memory array (e.g., random access memory or "RAM") to implement a shift register. In this technique special-purpose interconnections are providing in the memory array for selectively routing data read out of one column of the array into another column of the array. This technique also employs a single counter for providing both read and write addresses for the memory array.

The technique shown in the above-mentioned reference has many advantages. There may be some situations, however, in which this technique does not meet a user's needs. For example, the technique in the above-mentioned reference introduces extra switching into the data input path to the memory, which adds to and somewhat complicates the circuitry, and which may also slow down the input path to the memory. Because neither input nor output registers are included in the special-purpose routing that is added to the memory, the memory may have to be operated sub-optimally (i.e., at less than maximum speed) to ensure that no data is lost in routing it from one memory column to the next.

SUMMARY OF THE INVENTION

In accordance with certain aspects of the present invention, shift register circuitry includes a memory, write counter circuitry for selecting a plurality of portions of the memory in a repeating series for writing data into the memory, and read counter circuitry for selecting the plurality of portions of the memory in the repeating series for reading data from the memory. The read counter circuitry is maintained in the series ahead of where the write counter circuitry is in the series.

The amount by which the read counter circuitry is maintained ahead of the write counter circuitry is preferably based on compensating for the time required for data read from the memory to be written back into another part of the memory. For example, if there is a two-clock-cycle delay from reading to writing data, the read counter is maintained two read/write cycles ahead of the write counter (assuming that a read/write cycle corresponds to one clock cycle). Such a two-cycle-delay may be due to the provision of output buffer registers and input buffer registers for the memory. In such a case, data read out of the memory is first registered by the output registers and then routed to and registered by the input registers to make it ready for writing back into the other part of the memory.

Output tap data is derived from at least some of the data read from the memory.

If the shift register circuitry of this invention is included in a programmable logic device ("PLD"), the routing of signals read out of the memory back to another part of the memory may be through the general-purpose interconnection resources of the PLD. This avoids complicating the memory with special-purpose routing and/or switching.

Further features of the invention, its nature and various advantages will be more apparent from the accompanying drawings and the following detailed description of the preferred embodiments.

BRIEF DESCRIPTION OF THE DRAWINGS

FIG. 2 is an illustrative state table for the circuitry shown in FIG. 1.

DETAILED DESCRIPTION

Figure 1:
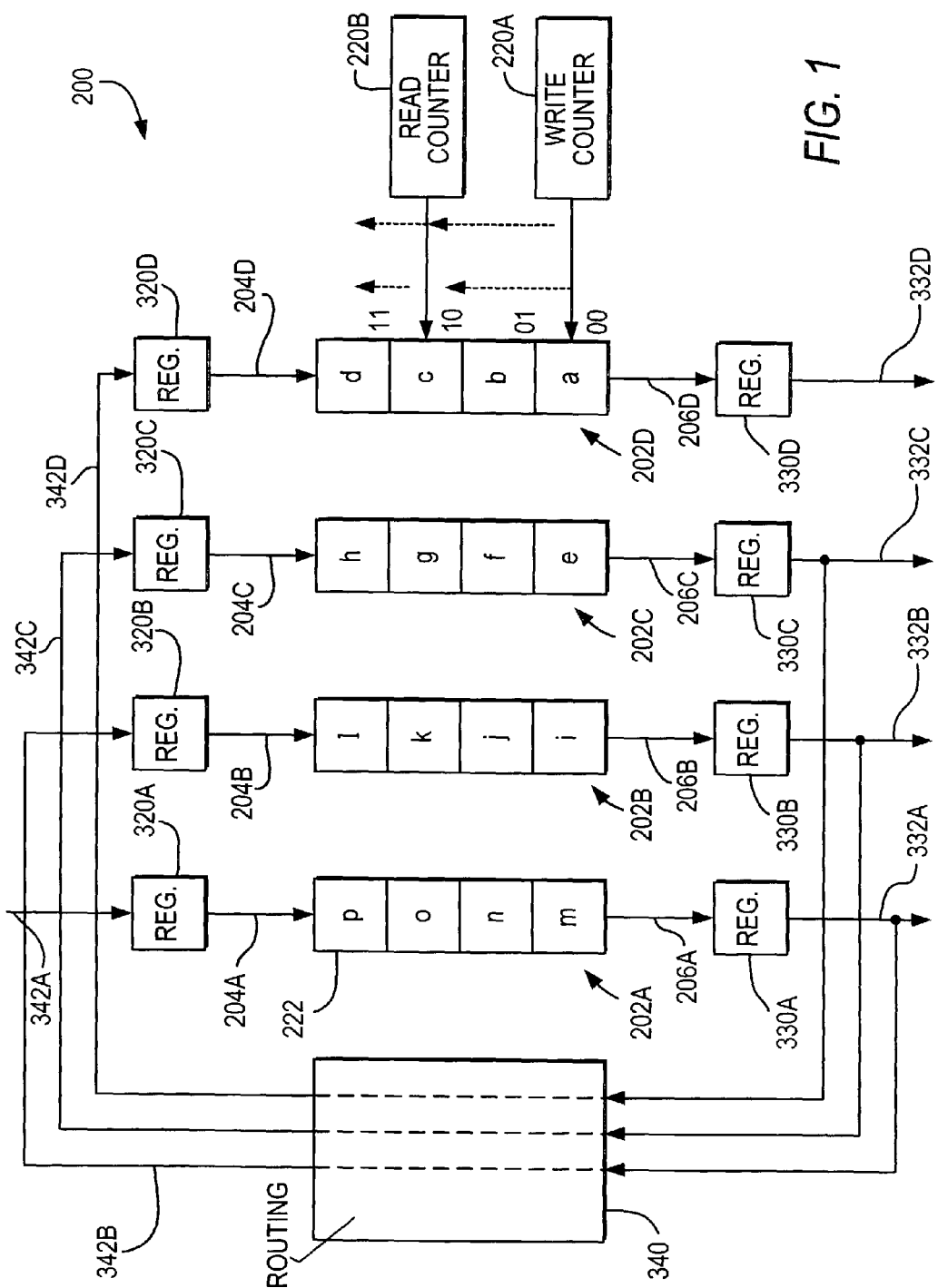
FIG. 1 is a simplified schematic block diagram showing an illustrative embodiment of circuitry in accordance with the invention.

To facilitate comparison with, and possible use of background information in, the above-mentioned reference (which is hereby incorporated by reference herein in its entirety), the same reference numbers are used in FIG. 1 for elements that can be the same as or similar to correspondingly numbered elements in the reference (especially FIG. 2 of the reference). It should be specifically noted, however, that single element 220 in the reference has two separate, approximately counterpart elements 220A and 220B in FIG. 1 herein. Also, reference number 200 continues to be used for the memory array as a whole, although in some respects the memory is differently configured and/or depicted herein. Elements in FIG. 1 that are not specifically shown in the reference have reference numbers herein in the 300 series.

As compared to what is shown in the above-mentioned reference, memory 200 is shown in FIG. 1 herein to additionally include (1) input registers 320A–320D (one for each column 202A–202D of memory cells 222), and (2) output registers 330A–330D (again, one for each column 202A–202D of memory cells 222). Also, as compared to what is shown in the reference, memory 200 herein preferably does not have the reference's special-purpose routing from column to column within the memory. Instead, other routing circuitry 340 is preferably included for providing connections from the output of one column to the input of the next column. Specifically, it will be noted that circuitry 340 connects the registered output 332A of memory column 202A to the registered input of memory column 202B via connection 342B. Similarly, circuitry 340 connects the registered output 332B of memory column 202B to the registered input of memory column 202C via connection 342C. And circuitry 340 connects the registered output 332C of memory column 202C to the registered input of memory column 202D via connection 342D.

If the circuitry shown in FIG. 1 is implemented in a programmable logic device ("PLD"), routing circuitry 340 can be part of the interconnection resources (typically at least partly general-purpose, and also typically at least partly programmable) of the PLD.

The presence and/or use of registers 320 and 330 may be wholly or partly optional. For example, either or both sets of registers 320 and 330 may be omitted if desired. Any set of registers that is provided may be bypassed and therefore not used if desired. This latter option can be provided, for example, in a PLD implementation of the invention (e.g., wherein memory circuitry 200 is provided on the PLD along with programmable logic circuitry).

Routing circuitry 340 may include additional registers in the paths between leads 332A–332C and connections 342B–342D. Any registers in the data paths (including registers 320, 330, and any registers in routing 340) may be referred to as buffering and/or pipelining registers. Again, in a PLD implementation of the invention, registers in routing 340 may be registers in programmable logic circuitry that is coupled to or associated with the interconnection resources of the device.

Two counters 220A and 220B are shown in FIG. 1 for addressing the rows of cells 222 in memory 200 when the memory is being used as a shift register. Each of these counters 220A and 220B operates generally like the single counter 220 shown in the above-mentioned reference to select or address one row cells 222 at a time. However, counter 220A is used only to address a row of cells 222 for writing data (on leads 204A–204D) into the addressed row of cells. Similarly, counter 220B is used only to address a row of cells 222 for reading data from that row of cells out onto leads 206A–206D. Each of counters 220A and 220B changes state (e.g., increments) after each cycle of a clock signal so that each counter addresses memory rows 00, 01, 10, 11 one after another in a repeating series (like a ring counter). In accordance with this invention (as will be described in more detail below) the initial starting points for counters 220A and 220B are different, and that difference is always maintained, but both counters eventually address all memory rows and do so in a closed loop repeating sequence or series.

In PLD embodiments of the invention, counters 220A and 220B can be implemented in programmable logic of the device if desired.

The clock signal (mentioned above) that controls incrementation of counters 220A and 220B (or other clock signals synchronized with that clock signal) also preferably controls operation of registers 320 and 330 and any additional pipelining registers in routing circuitry 340.

Assuming for purposes of the immediately following discussion that registers 320 and 330 are provided and used, but that no other registers are provided in the routing from leads 332A–332C to connections 342B–342D, the resulting pipelining delay is two clock cycles. In other words, a signal read out via lead 206A, for example, is delayed by two clock cycles (due to having to pass successively through registers 330A and 320B) before it can be written into the next memory column from lead 204B. The same amount of delay is experienced (due to registers 330B and 320C) by a signal read out via lead 206B before it can be written into the next column from lead 204C, and the same is true (due to registers 330C and 320D) for a signal read out via lead 206C before it can be written into the next column from lead 204D.

To account for this amount of pipelining delay in accordance with this invention, read counter 220B is always operated two memory rows ahead of write counter 220A. For example, operation of the shift register circuitry of this invention starts with write counter 220A initialized to 00 (i.e., to address row 00 in the memory circuitry), and with read counter 220B initialized to 10 (i.e., to address row 10 in the memory circuitry). Thereafter, each clock cycle causes both of counters 220A and 220B to increment, so that the sequence for write counter 220A is 00, 01, 10, 11, 00, 01, 10, 11, . . . , and the sequence for read counter 220B is 10, 11, 00, 01, 10, 11, 00, 01, . . . .

By having read counter 220B operate two clock cycles ahead of write counter 220A when the latency (delay) from the output of each memory column to the input of the next memory column is two clock cycles, the relative advance of the read clock completely and exactly compensates for that delay. Despite the presence of two clock cycles of delay due to the presence of registers 320 and 330, the circuitry operates exactly like a 16-position shift register with four taps (332A–332D) spaced four positions apart along the 16 positions. In other words, the illustrative shift register circuitry shown in FIG. 1 has the same general or overall shift register configuration and operation as the illustrative shift register circuitry shown in FIG. 2 of the above-mentioned reference. (There are, of course, important differences in the implementations of these two shift register circuitries. These differences have been discussed above.)

FIG. 2 is an illustrative state table for operation of the illustrative circuitry shown in FIG. 1. FIG. 2 is analogous, and therefore bears some general resemblance, to FIG. 3 in the above-mentioned reference. In the following discussion the 11 columns in FIG. 2 are referred to from left to right. For example, the left-most column in FIG. 2 is referred to as the "first" column, and the right-most column is referred to as the "eleventh" column.

The first column in FIG. 2 identifies 16 successive clock cycles, and therefore 16 successive states in the state table. Each row in the state table specifies one respective state of the FIG. 1 apparatus.

The second and third columns in FIG. 2 respectively indicate the contents of read counter 220B and write counter 220A during each of the depicted states. Thus, for example, in the first state (clock cycle 1; top row) read counter 220B is addressing memory row 10 for reading, and write counter 220A is addressing memory row 00 for writing. In the second state (clock cycle 2; second row) read counter 220B is addressing memory row 11 for reading, and write counter 220A is addressing memory row 01 for writing.

The fourth column in FIG. 2 contains read state information for memory column 202A in FIG. 1. The next three columns in FIG. 2 contain similar read state information for memory columns 202B–202D, respectively. The eighth column in FIG. 2 contains write state information for memory column 202A, and the next three columns contain similar write state information for memory columns 202B–202D, respectively. (Memory columns 202A–202D are respectively identified in FIG. 2 by column addresses 11, 10, 01, 00 in the headings of columns four through eleven in FIG. 2.)

In general, throughout columns four through eleven in FIG. 2, "x" denotes a "don't care" condition or value. In columns four through seven, entries of the form "#/y/z" have the following meaning: "#" is the number of a particular bit in the bit stream being shifted through the shift register; "y" is the cell 222 in the memory that is being read; and "z" is the memory cell 222 from which the data currently in the associated output register 330 came. For example, the entry "2/n/m" means that memory cell "n" is being read for the second bit in the bit stream, and that the data currently in output register 330A came from memory cell "m".

In columns eight through eleven, entries of the form "#/y" have the following meaning: "#" is the number of a particular bit in the bit stream that is being written; and "y" is the memory cell 222 into which that data is being written.

The entire table in FIG. 2 (and all corresponding states and operations of the FIG. 1 circuitry) will be fully understood from the following description of the first few representative lines or rows in the table.

During clock cycle 1 (assumed to be at the start of operation of the shift register) the count in read counter 220B is 10 and the count in write counter 220A is 00. Accordingly, read counter 220B addresses memory row 10 (including the memory cells 222 more specifically identified in FIG. 1 as cells "o", "k", "g", and "c"). There is no meaningful data thus read from these cells (as indicated by the "x" entries in this row of the read state columns in FIG. 2). At the same time write counter 220A addresses memory row 00 (including the memory cells 222 more specifically identified in FIG. 1 as cells "m", "i", "e", and "a"). The only meaningful data assumed to be present on leads 204A–204D is the first bit of the data stream on lead 204A. Accordingly, this first bit ("1") is written into memory cell "m" as indicated by the entry "1/m" at the top of the eighth column in FIG. 2. The entries "x" at the top of the ninth through eleventh columns in FIG. 2 indicate that nothing meaningful is written into the rest of memory row 00.

During clock cycle 2 read counter 220B advances to address row 11 and write counter 220A advances to address row 01. The read operation that takes place during clock cycle 2 again involves only meaningless ("x") data, and so no further discussion of it is needed. The second bit in the data stream is now present on lead 204A, so that second bit ("2") is written into cell "n" as indicated by the entry "2/n" in the second row and eighth column in FIG. 2.

During clock cycle 3 read counter 220B advances (in recirculating, ring counter fashion) to address row 00 and write counter 220A advances to address row 10. As a consequence, read counter 220B causes the first bit ("1") in the bit stream to be read out of cell "m" as indicated by the entry "1/m/x" in the third row and fourth column in FIG. 2. The "x" in this entry indicates that the data previously stored in output register 330A is of no consequence. No other reading of consequence takes place during clock cycle 3. The significant writing that takes place during this clock cycle is writing of the third bit ("3") in the bit stream into memory cell "o" as indicated by the entry "3/o" in the third row and eighth column in FIG. 2. No other writing of consequence takes place during clock cycle 3.

During clock cycle 4, read counter 220B advances to address row 01 and write counter 220A advances to address row 11. As a consequence, read counter 220B causes the second bit ("2") in the data stream to be read out of cell "n", while bit "1", previously read from cell "m", is stored in and output by output register 330A. This is all indicated by the entry "2/n/m" in the fourth row and fourth column in FIG. 2. No other reading of consequence takes place. The only significant writing that occurs is writing of the fourth bit ("4") in the data stream in memory cell "p" as indicated by the entry "4/p" in the fourth row and eighth column in FIG. 2.

During clock cycle 5, the data previously being output by output register 330A is stored in and becomes the output of input register 320B. Also during clock cycle 5, read counter 220B advances to address row 10 and write counter 220A advances (in recirculating, ring counter fashion) to address row 00. The only significant reading that takes place is reading of the third bit ("3") in the data stream from memory cell "o". The data stored in and output by output register 330A becomes the data previously read from memory cell "n" (i.e., the second bit "2"). This is all indicated by the entry "3/o/n" in the fifth row and fourth column in FIG. 2. The significant writing that takes place during the fifth clock cycle is writing of the fifth bit ("5") in the data stream into memory cell "m", and writing of the first bit ("1") in the data stream (now being output by input register 320B as described above) into memory cell "i". These significant writes are indicated by the entries "5/m" and "1/i" in the fifth row and eighth and ninth columns in FIG. 2. No other significant writes take place at this time.

It should now be apparent how FIG. 2 describes the various successive states of the FIG. 1 circuitry as data is shifted into and through that circuitry. The number of significant reads and writes gradually increases as meaningful data is gradually shifted from left to right across memory 200. For example, during clock cycle 7, two significant reads and two significant writes are performed. During clock cycle 9, there are two significant reads and three significant writes. By clock cycle 15 and thereafter there are four significant reads and four significant writes. Leads 332A–332D are the output taps of the shift register. They provide outputs after four, eight, 12, and 16 shift register stages, respectively.

The amount by which read counter 220B needs to be advanced relative to write counter 220A in accordance with this invention depends on the amount of delay in the feedback path from memory reading to memory writing. In the example discussed immediately above this amount of delay is assumed to be two clock cycles (due to the presence of registers 330 and 320 in the feedback path from memory reading to memory writing). To compensate for this amount of delay, read counter 220B is advanced by two memory rows relative to write counter 220A. If there were three registers in the feedback path (e.g., as a result of an additional register in each of the feedback paths in circuitry 340), read counter 220B would need to be advanced by three memory rows relative to write counter 220A. If there were only one register in the feedback path (e.g., as a result of omitting or bypassing either input registers 320 or output registers 330), read counter 220B would need to be advanced by only one memory row relative to write counter 220A.

It should be mentioned that separate read and write counters are employed in accordance with this invention for shift registers with a tap distance of three or more shift register stages. For a tap distance of two, a single counter (a TFF) is sufficient because input and output registers 320 and 330 inherently provide two shift register stages between input 342A and output 332A, two more shift register stages between output 332A and output 332B, etc. For a tap distance of one, no counters are needed. For this special case, an external DFF is needed to save cell contents that were just written.

Figure 3:
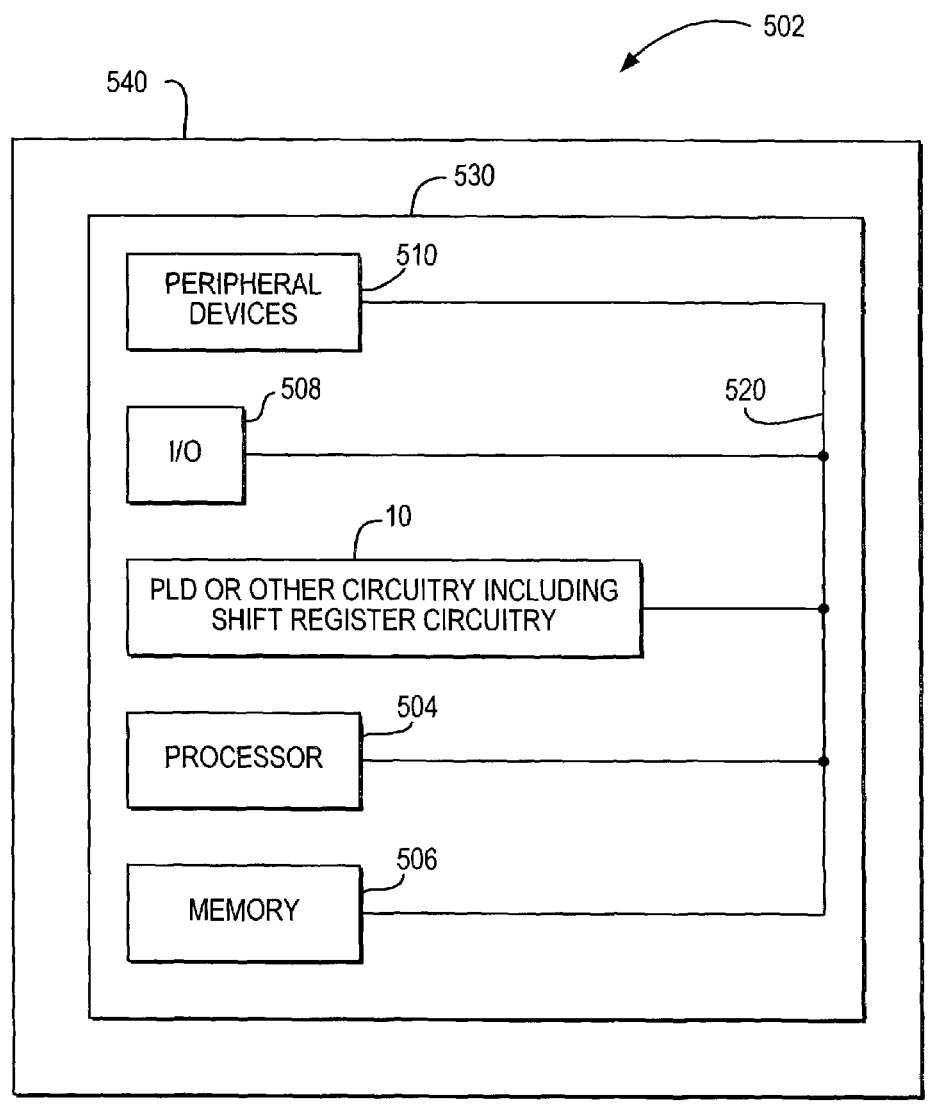
FIG. 3 is a simplified block diagram of an illustrative system employing circuitry in accordance with the invention.

FIG. 3 illustrates a PLD or other circuitry 10 including shift register circuitry in accordance with this invention in a data processing system 502. Data processing system 502 may include one or more of the following components: a processor 504; memory 506; I/O circuitry 508; and peripheral devices 510. These components are coupled together by a system bus or other interconnections 520 and are populated on a circuit board 530 (e.g., a printed circuit board) that is contained in an end-user system 540.

System 502 can be used in a wide variety of applications, such as computer networking, data networking, instrumentation, video processing, digital signal processing, or any other application. Circuitry 10 may be used to perform a variety of different logic functions. For example, circuitry 10 may be configured as a processor 504. Circuitry 10 may also be used as an arbiter for arbitrating access to a shared resource in system 502. In yet another example, circuitry 10 can be configured as an interface between processor 504 and one of the other components in system 502. It should be noted that system 502 is only exemplary, and that the true scope and spirit of the invention should be indicated by the following claims.

As in the above-mentioned reference, it will be understood that the illustrative embodiment shown and specifically described herein is only an example that is not intended to be limiting in any way. Everything said in the above-mentioned reference about possible variations is equally applicable in the present context. For example, and not by way of limitation, only a relatively small memory 200 is shown and specifically described herein, but the memory can be of any size (e.g., smaller or larger than what is shown herein, and these variations can be with respect to either or both of the number of rows and the number of columns in the memory). If the memory available has more rows than the shift register tap spacing that is needed, only the rows that are needed can be used by eliminating the range over which counters 220A and 220B operate. Similarly, if the memory available has fewer rows than the required shift register tap spacing, data can be passed through more than one column between taps to thereby increase tap spacing. (In other words, only the outputs of certain columns are used as taps.) If the memory available has more columns than are needed, the extra columns can simply be ignored (i.e., not used).

Words like "row" and "column" are used herein purely as a matter of convenience and not with the intention of limiting the invention to any particular physical or geometrical arrangement of the circuitry. Only the operative relationship of the memory cells is relevant, not their geometric arrangement or orientation. Thus references to "rows" and "columns" refer only to operative relationships. Because the memories employed in accordance with this invention are preferably random access memories, the rows do not have to be addressed in any particular order, as long as the order chosen is used consistently. Similarly, data does not have to be shifted between immediately adjacent columns. Instead, the columns can be used in any order as long as the same order is used for the output taps.

As has been said, other types of variation, modification, and the like mentioned in the above-mentioned reference are equally applicable to the illustrative material provided herein. Thus it will be understood that the foregoing is only illustrative of the principles of the invention, and that various modifications can be made by those skilled in the art without departing from the scope and spirit of the invention.

The invention claimed is:

1. Shift register circuitry comprising:
    random access memory circuitry including a two-dimensional array of intersecting rows and columns of memory cells;
    input circuitry associated with each of the columns for conveying data in parallel to all of the cells in the associated column;
    output circuitry associated with each of the columns for conveying data from the associated column;
    write counter circuitry for selecting a each of the rows, one after another, in a repeating series for writing data into the memory cells in the selected row, the data that is written into each memory cell in the selected row being the data that is then being conveyed in parallel to all of the cells in the column that includes that cell by the input circuitry associated with that column;
    read counter circuitry for selecting each of the rows, one after another, in the repeating series for reading data from the memory cells in the selected row, the data that is read from each memory cell in the selected row being applied to the output circuitry associated with the column that includes that cell, the read counter circuitry being maintained in the series ahead of where the write counter circuitry is in the series; and
    a feedback connection from the output circuitry associated with at least one of the columns to the input circuitry associated with a different one of the columns.

2. The circuitry defined in claim 1 wherein the feedback connection has a predetermined signal transmission delay, and wherein substantially the same delay is present in the time between when the read counter circuitry selects a row of the memory and when the write counter circuitry next selects that same row of the memory.

3. The circuitry defined in claim 1 wherein:
    the input circuitry comprises at least one input register from which data is written into the memory; and
    the output circuitry comprises at least one output register into which data is read from the memory.

4. The circuitry defined in claim 1 wherein the feedback connection comprises:
    an output register into which data is read from a first of the columns of the memory;
    an input register from which data is written into a second of the columns of the memory; and
    a connection from an output of the output register to an input of the input register.

5. The circuitry defined in claim 4 wherein the read counter, the write counter, the output register, and the input register are all clocked in synchronism at a predetermined clock rate.

6. The circuitry defined in claim 4 wherein the read counter is maintained two rows of the memory ahead of the write counter in the series.

7. A digital processing system comprising:
    processing circuitry;
    a further memory coupled to the processing circuitry; and
    shift register circuitry as defined in claim 1 coupled to the processing circuitry and the further memory.

8. A printed circuit board on which is mounted shift register circuitry as defined in claim 1.

9. The printed circuit board defined in claim 8 further comprising:
    a further memory mounted on the printed circuit board and coupled to the shift register circuitry.

10. The printed circuit board defined in claim 8 further comprising:
    processing circuitry mounted on the printed circuit board and coupled to the shift register circuitry.

11. The method of operating a random access memory array as a shift register, the random access memory circuitry including a two-dimensional array of intersecting rows and columns of memory cells, input circuitry associated with each of the columns for conveying data in parallel to all of the cells in the associated column, and output circuitry associated with each of the columns for conveying data from the associated column, the method comprising:
    writing successive data bits into different cells, selected in a repeating series one after another, in a first column of the memory array, the data that is written being the data that is then being conveyed in parallel to all of the cells in the column that includes that cell by the input circuitry associated with that column;
    reading successive data bits from the different cells in the first column in the repeating series but advanced in the series by at least one cell as compared to where the writing is in the series, the data that is read from each memory cell in the first column being applied to the output circuitry associated with the column; and
    writing the successive data bits that are read from the output circuitry associated with the first column via the input circuitry associated with a second column of the memory array into different cells, selected in a repeating series one after another, in the second column of the memory array, this writing of a data bit being delayed from the reading of that bit.

12. The method defined in claim 11 wherein the time required for the first-mentioned writing to next reach a location in the series from which a reading has occurred is substantially equal to the delay in the second-mentioned writing.

13. The method defined in claim 11 wherein the delay in the second-mentioned writing is a result of passing data bits from the reading through at least one register.

14. The method defined in claim 11 wherein the delay in the second-mentioned writing is a result of passing data bits through an output register of the output circuitry and then through an input register of the input circuitry.

15. The method defined in claim 14 further comprising:
clocking the output and input registers in synchronism with stepping along the series.

16. The method defined in claim 15 wherein the reading is advanced in the series by two cells as compared to where the writing is in the series.

17. The method defined in claim 11 further comprising:
using data bits from the reading to produce output tap data bits.

18. The method defined in claim 11 further comprising:
reading successive data bits from the different cells in the second column in the repeating series but advanced in the series by at least one cell as compared to where the writing is in the series.

19. The method defined in claim 18 further comprising:
using data bits from at least one of the first- and second-mentioned readings as output tap data bits.

20. Shift register circuitry comprising:
random access memory circuitry operable as a two-dimensional array of intersecting rows and columns of memory locations;
input circuitry associated with each of the columns for conveying data in parallel to all of the locations in the associated column;
output circuitry associated with each of the columns for conveying data from the associated column;
write counter circuitry that addresses each of the rows, one after another, in a repeating series for writing data into the memory locations in a row as it is addressed, the data that is written into each memory location in the addressed row being the data that is then being conveyed in parallel to all of the locations in the column that includes that location by the input circuitry associated with that column;
read counter circuitry that addresses each of the rows, one after another, in the repeating series for reading data from the memory locations in a row as it addressed, the data that is read from each memory location in the addressed row being applied to the output circuitry associated with the column that includes that location; and
routing circuitry that routes data read from the output circuitry associated with at least a first of the columns for writing into a second of the columns via the input circuitry associated with the second column, this data being available for writing only a delay time interval after it was read, wherein the read counter circuitry addresses each of the rows, one after another, an advance time interval before the write counter circuitry addresses that row, and wherein the advance time interval is approximately equal to the delay time interval.

21. The circuitry defined in claim 20 wherein:
the input circuitry comprises register circuitry that registers data to be written into the memory circuitry; and
the output circuitry comprises register circuitry that registers data read from the memory circuitry.

22. The circuitry defined in claim 21 wherein the routing circuitry connects an output of the output register circuitry to an input of the input register circuitry.

23. The circuitry defined in claim 22 wherein the delay time interval is primarily due to passing data successively through the output register circuitry and the input register circuitry.

24. The circuitry defined in claim 23 wherein the write counter circuitry and the read counter circuitry are clocked in synchronism with the output register circuitry and the input register circuitry.

25. The circuitry defined in claim 24 wherein the read counter circuitry is maintained in the series two rows ahead of where the write counter circuitry is in the series.

26. The circuitry defined in claim 20 further comprising:
output tap circuitry that derives output tap data from data read from at least one of the first and second columns.

* * * * *